(12) United States Patent
Ueda et al.

(10) Patent No.: US 7,244,178 B2
(45) Date of Patent: Jul. 17, 2007

(54) COMMUNICATION DEVICE, COOLING FAN UNIT, AND OPERATION CONTROL METHOD FOR THE COOLING FAN UNIT

(75) Inventors: Satoshi Ueda, Kawasaki (JP); Naoya Yamazaki, Kawasaki (JP); Kazuhiro Iino, Kawasaki (JP); Takashi Shirakami, Kawasaki (JP); Yoshiaki Tada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 209 days.

(21) Appl. No.: 10/740,124

(22) Filed: Dec. 17, 2003

(65) Prior Publication Data

US 2004/0196631 A1    Oct. 7, 2004

(30) Foreign Application Priority Data

Dec. 18, 2002    (JP) ............................. 2002-366144

(51) Int. Cl.
*H05K 5/00* (2006.01)
(52) U.S. Cl. ...................... 454/184; 361/695; 165/80.3
(58) Field of Classification Search ........ 361/687–697; 165/80.3, 121, 122; 454/184
See application file for complete search history.

(56) References Cited

U.S. PATENT DOCUMENTS 5,063,477 A * 11/1991 Paggen et al. ............. 361/695
5,414,591 A * 5/1995 Kimura et al. ............. 361/695
6,646,878 B2 * 11/2003 Chan ........................ 361/695
2002/0191376 A1 * 12/2002 Ota et al. .................. 361/695
2003/0151894 A1 * 8/2003 Singer ....................... 361/695
2004/0023614 A1 * 2/2004 Koplin ...................... 454/184
2004/0090744 A1 * 5/2004 Beitelmal et al. .......... 361/695

FOREIGN PATENT DOCUMENTS

JP        5-007376       1/1993
JP        5-259673      10/1993

* cited by examiner

*Primary Examiner*—Gregory Wilson
(74) *Attorney, Agent, or Firm*—Katten Muchin Rosenman LLP

(57) ABSTRACT

A communication device which has high cooling efficiency and can be reduced in size and weight. The communication device in which a plurality of electronic circuit boards are mounted to a back wiring board (BWB) includes a casing containing the electronic circuit boards as a unit, an intake fan unit for introducing air into the casing to cool the electronic circuit boards, and a discharge fan unit having a plurality of blower fans each arranged such that air intake and discharge directions thereof form an angle of nearly 90 degrees, the blower fans discharging the air introduced into the casing. Combined use of an axial fan and the blower fans permits air to be introduced into and discharged from the casing from rear and front sides, respectively, of the casing, whereby spaces that the fan units occupy in the communication device can be reduced.

4 Claims, 19 Drawing Sheets

| OPERATION MODE | BLOWER FAN 11 | BLOWER FAN 12 | BLOWER FAN 13 | AXIAL FAN 21 |
|---|---|---|---|---|
| FAIL 1 | $\leq r0$ | $r2$ | $r2$ | $r3$ |
| FAIL 2 | $r2$ | $\leq r0$ | $r2$ | $r3$ |
| FAIL 3 | $r2$ | $r2$ | $\leq r0$ | $r3$ |
| REMOVE | STOPPED (TIME LIMIT: 3 MIN.) | | | $r3$ |

FIG. 18

COMMUNICATION DEVICE, COOLING FAN UNIT, AND OPERATION CONTROL METHOD FOR THE COOLING FAN UNIT

BACKGROUND OF THE INVENTION (1) Field of the Invention

This invention relates to a communication device provided with a plurality of electronic circuit boards, such as a platform information communication device, a cooling fan unit and an operation control method for the cooling fan unit, and more particularly, to a communication device comprising multiple electronic circuit boards mounted to a back wiring board (BWB).

(2) Description of the Related Art

A conventional cooling structure for an electronic unit is disclosed in Japanese Unexamined Patent Application No. 05-259673, for example. According to this publication, a cooling system is constructed by mounting a cooling fan to an electronic unit constituted by a combination of intense heat-generating communication devices, such as electronic exchanges, such that air is forced to flow through the interior of the electronic unit. In this cooling system, the intense heat-generating communication devices are provided with fins, in order to reduce the size of the heat radiator of the electronic unit and thereby reduce the size and weight of the unit, and cooling air is forced to flow along the fins by an axial fan.

FIG. 19 is a side view schematically showing the construction of a communication device using a conventional cooling system.

The cooling system for the communication device 1 has axial fans arranged on cooling air inlet and outlet sides, respectively, and is generally called push-pull type. A fan unit 100 constituted by two axial fans 101 and 102 serves to suck cooling air coming from an air inlet 110 arranged at a lower portion of the device into the interior of the communication device 1. A discharge fan unit 200 is adapted to dispel heat to outside from an air outlet 210 arranged at an upper portion of the communication device 1, and is constituted by two axial fans 201 and 202.

A plurality of electronic circuit boards (not shown), for which the cooling system is provided, are inserted as a plug-in unit (PIU) into the communication device 1 from the front side thereof such that the boards are directed vertically between the two fan units 100 and 200 and arranged side by side. Arrow A appearing in the left part of FIG. 19 indicates the direction of insertion of the electronic circuit boards.

In the conventional cooling system, the four axial fans 101, 102, 201 and 202 are operated at all times to function as a push-pull type fan system so that heat can be dispelled to outside from the communication device 1. Thus, the communication device 1 needs to include spaces for containing the two fan units 100 and 200, respectively, a space for containing a shielding plate 111 which allows air to be introduced into the intake fan unit 100 from the air inlet 110 at the lower portion of the front of the communication device, and a space for containing another shielding plate 211 which guides the air from the discharge fan unit 200 toward the air outlet 210 at the upper portion of the back of the communication device.

In the push-pull type cooling system constituted by axial fans as described above, the cooling air is sucked in and discharged both in a horizontal direction, as indicated by arrows B and C, respectively, in FIG. 19. Accordingly, the communication device 1 inevitably has an increased size which is larger than the width or height of the electronic circuit boards by an extra amount corresponding to the thicknesses of the axial fans of the fan units 100 and 200 and the spaces allotted to the air inlet 110 and outlet 210. Also, in the case of the conventional communication device 1 in which the electronic circuit boards as a plug-in unit are positioned horizontally and arranged one above another, the cooling air cannot be smoothly sucked in and discharged when a plurality of such communication devices are mounted on a rack.

SUMMARY OF THE INVENTION

An object of the present invention is to provide a communication device having high cooling efficiency and permitting reduction of size and weight thereof, a cooling fan unit and an operation control method for the cooling fan unit.

To achieve the object, there is provided a communication device having a plurality of electronic circuit boards mounted to a back wiring board (BWB). The communication device comprises a casing containing the electronic circuit boards as a unit, an intake fan unit for introducing air into the casing to cool the electronic circuit boards, and a discharge fan unit including a blower fan arranged such that air intake and discharge directions thereof form an angle of nearly 90 degrees, the blower fan discharging the air introduced into the casing.

Also, to achieve the above object, there is provided a cooling fan unit for cooling a plurality of electronic circuit boards electrically connected by a BWB. The cooling fan unit comprises a fan unit casing containing a blower fan, a control circuit board arranged parallel with the BWB of the cooling fan unit and facing the BWB, for controlling operation of the blower fan, and a plug-in connector arranged in a predetermined position of the control circuit board such that the plug-in connector is connected to a connector on the BWB when the fan unit casing is mounted to a cooling position of the electronic circuit boards.

Further, to achieve the above object, there is provided an operation control method for a cooling fan unit having a blower fan which is fitted in a casing containing an electronic circuit board for cooling interior of the casing. The cooling fan unit operation control method comprises the step of temporarily increasing starting torque of the blower fan only for a short period of time immediately after operation of the cooling fan unit is started, to cause rotation speed of the blower fan to reach a steady-state value in an early stage after start of the blower fan.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 18 is a table showing the rotation speeds of the blower fans and axial fan in individual operation modes.

DESCRIPTION OF THE PREFERRED EMBODIMENTS

Embodiments of the present invention will be hereinafter described with reference to the drawings.

The invention will be described first with reference to a communication device in which a plug-in unit is mounted horizontally.

Figure 1:
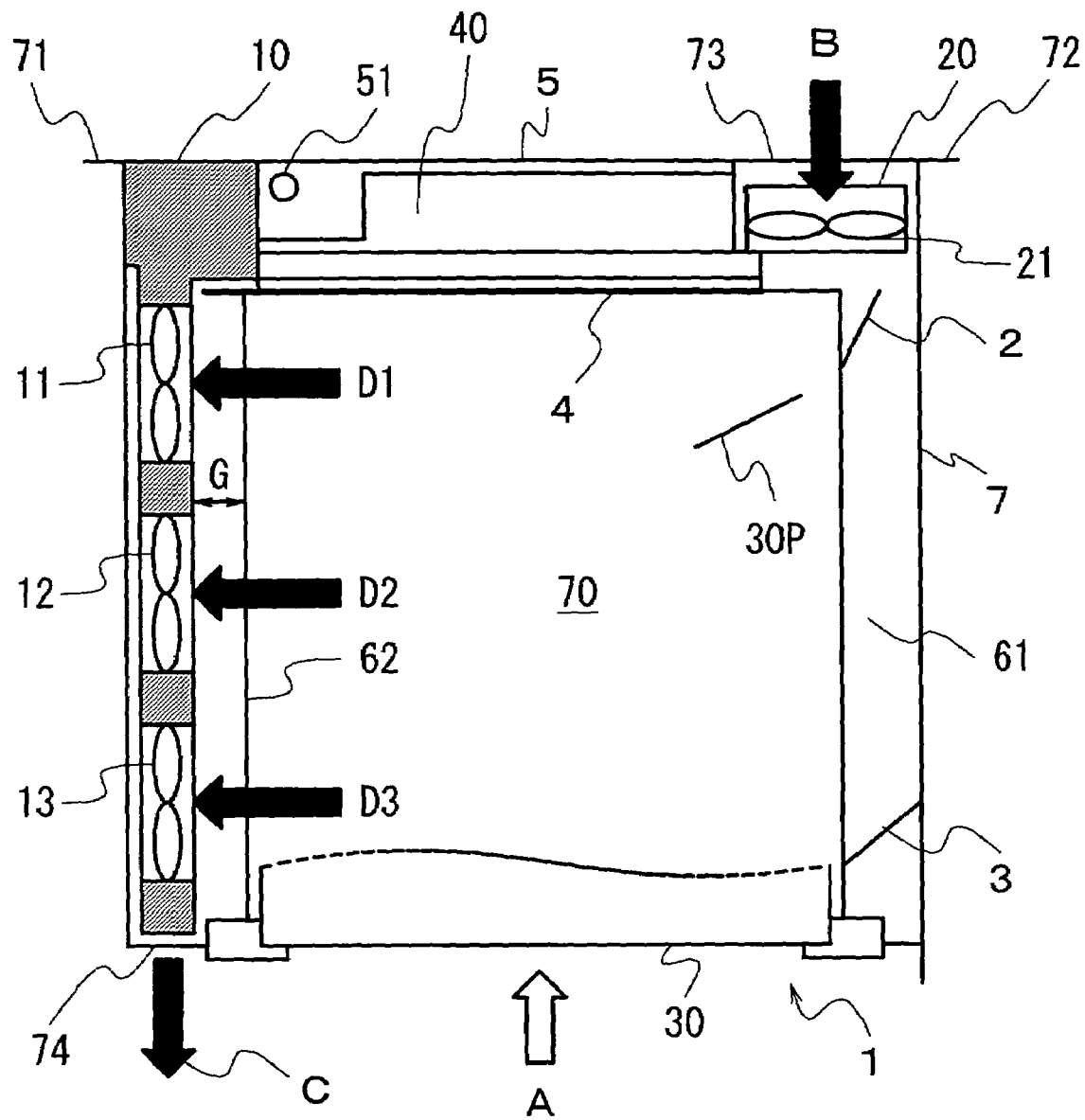
FIG. 1 is a schematic plan view of a communication device equipped with a cooling system which has a push-pull arrangement constituted by blower fans and an axial fan.

FIG. 1 is a schematic plan view of a communication device equipped with a cooling system which has a push-pull arrangement constituted by blower fans and an axial fan.

The cooling system of the communication device 1 differs in construction from the conventional cooling system in that it includes three blower fans 11, 12 and 13 as a pull-side fan unit 10. On the cooling air inlet side, however, a fan unit 20 including an axial fan 21 is used. The fan unit 20 is arranged on the right side of the back of the communication device 1, and the fan unit 10 including the blower fans 11, 12 and 13 is inserted in the left-hand portion of the communication device 1 from the back thereof.

A plurality of electronic circuit boards, for which the cooling system is provided, are illustrated as a plug-in unit 30 which is inserted into an internal space 70 of the communication device 1 from a direction indicated by arrow A such that the electronic circuit boards are mounted horizontally inside a casing 7. The communication device 1 has an air duct 61 communicating with an air inlet 73, and cooling air indicated by air flow vector B is introduced from the fan unit 20 into the air duct 61 and the internal space 70 of the casing 7. The internal space 70 of the casing 7 is an area where the electronic circuit boards are accommodated when the plug-in unit 30 is inserted in the communication device 1, and the air duct 61 is formed adjacent to the internal space 70 of the casing 7. A baffle plate 2 is arranged in the air duct 61 in the vicinity of the fan unit 20 to divide the air flow introduced into the casing 7, as described later. Another baffle plate 3, separate from the baffle plate 2, is arranged in the air duct 61 at a distance from the fan unit 20.

A back wiring board (BWB) 4, on which power supply lines etc. are wired, is arranged in the internal space 70 and fixed to the communication device 1 near the back thereof. The BWB 4 permits a plurality of electronic circuit boards to be horizontally mounted thereto at predetermined intervals, and a part thereof is cut away to admit the air from the fan unit 20. The back of the communication device 1 is covered with a cover 5 which is attached to the casing 7 through a pivot 51 to be opened and closed. A space 40 for wiring is defined between the cover 5 and the rear side of the BWB 4.

The cooling air introduced into the casing 7 from the air inlet 73 at the back of the device passes between the electronic circuit boards and is drawn horizontally from the air duct 61 by the blower fans 11, 12 and 13 of the fan unit 10. The fan unit 10 is removably inserted from the back of the device into an air duct 62 located on the left side of the casing 7 as viewed from the front thereof, and is positioned in the air duct 62 such that a predetermined gap G exists between the fan unit 10 and the internal space 70. An attachment/detachment mechanism of the fan unit 10 will be described in detail later.

Arrows D1, D2 and D3 appearing in FIG. 1 indicate magnitudes of wind velocity vectors associated with the blower fans 11, 12 and 13, respectively. The magnitudes of the wind velocity vectors D1, D2 and D3 are proportional to the quantities of air drawn by the respective blower fans 11, 12 and 13 of the fan unit 10. Also, the directions of the wind velocity vectors D1, D2 and D3 in which air is drawn by the fan unit 10 are at right angles with the direction of the air flow vector B in which air is introduced from the axial fan 21 into the air duct 61. The blower fans 11, 12 and 13 of the fan unit 10 have the function of discharging air heated inside the communication device 1 from an air outlet 74 formed on the left side of the front of the device 1 in a direction indicated by air flow vector C.

Each of the electronic circuit boards has a baffle plate 30P formed at a predetermined position thereof to regulate the flow of cooling air passing between the boards. Also, fixtures 71 and 72 for fixing the communication device 1 to a rack are secured to left and right portions of the back of the casing 7 by screws or the like.

Figure 2:
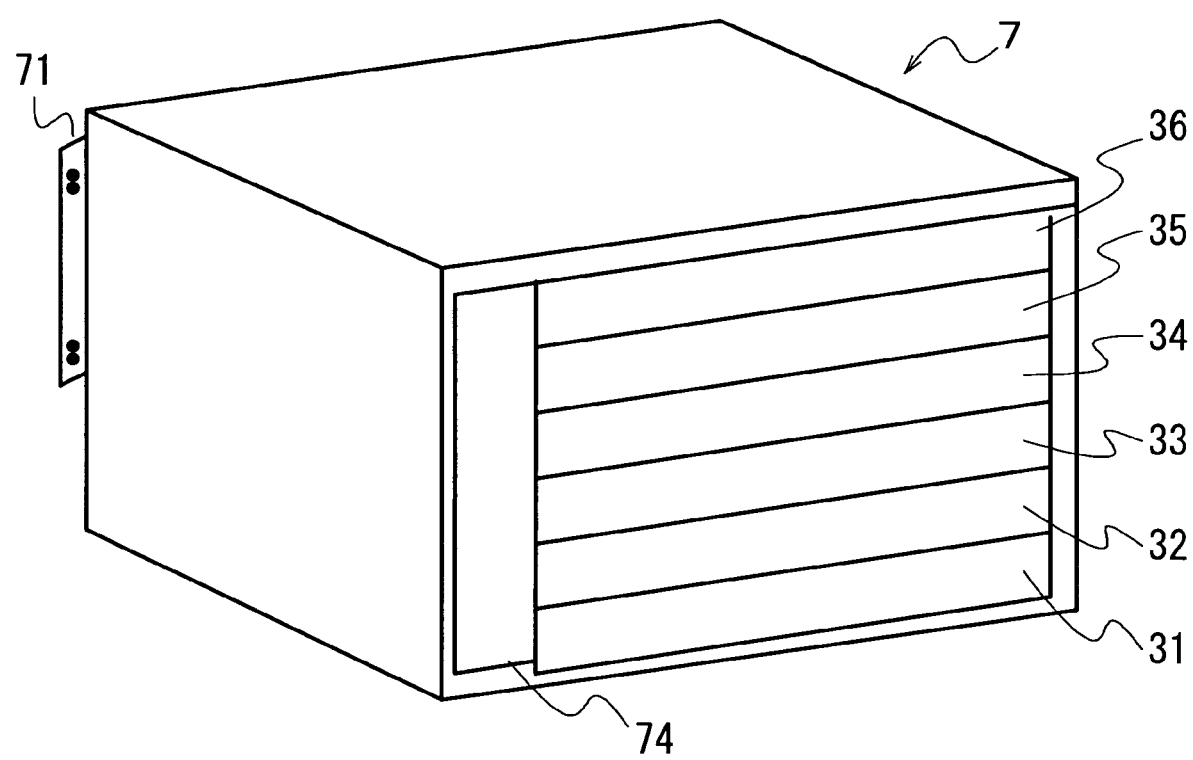
FIG. 2 is a perspective view showing external appearance of the communication device.

FIG. 2 is a perspective view showing external appearance of the communication device.

Electronic circuit boards 31 to 36 constituting a six-tier plug-in unit are inserted into the communication device 1 from the front thereof. In this embodiment, heat generated by the electronic circuit boards 31 to 36 is dispelled by the three blower fans 11, 12 and 13 through the air outlet 74 formed on the left side of the front of the casing 7.

Thus, in the embodiment described above, the blower fans 11, 12 and 13 are used in combination with the axial fan 21 to constitute a push-pull type cooling system, whereby the extra lower and upper spaces required in the conventional device for containing the shielding plates 111 and 211 can be omitted from the communication device 1. Also, the baffle plates 2 and 3, the air duct 61, etc. permit the cooling air taken in from the fan unit 20 to flow uniformly through the internal space 70 at a constant flow rate, and accordingly, increase in the temperature inside the communication device 1 can be prevented without fail.

In cases where the cooling system is continuously operated, a problem described below arises in connection with a fan control circuit, as known in the art. The fan control circuit has the function of monitoring the rotation speed of each fan to detect deterioration of the fan motor and outputting an alarm if the rotation speed drops below a minimum speed, as described later. Also, at the start of the fan motor, the alarm signal needs to be masked so as not to be generated unnecessarily. The masking time is conventionally set to about 1.5 sec, which is sufficiently long for the axial fan 21. However, the blower fans 11, 12 and 13 require a longer time for their motor rotation to become stable than in the case of the axial fan. Accordingly, an additional fan control circuit separate from that for the axial fan 21 is prepared and a longer alarm masking time is set therein so that an alarm may not be output at the start of the fan motor.

Figure 3:
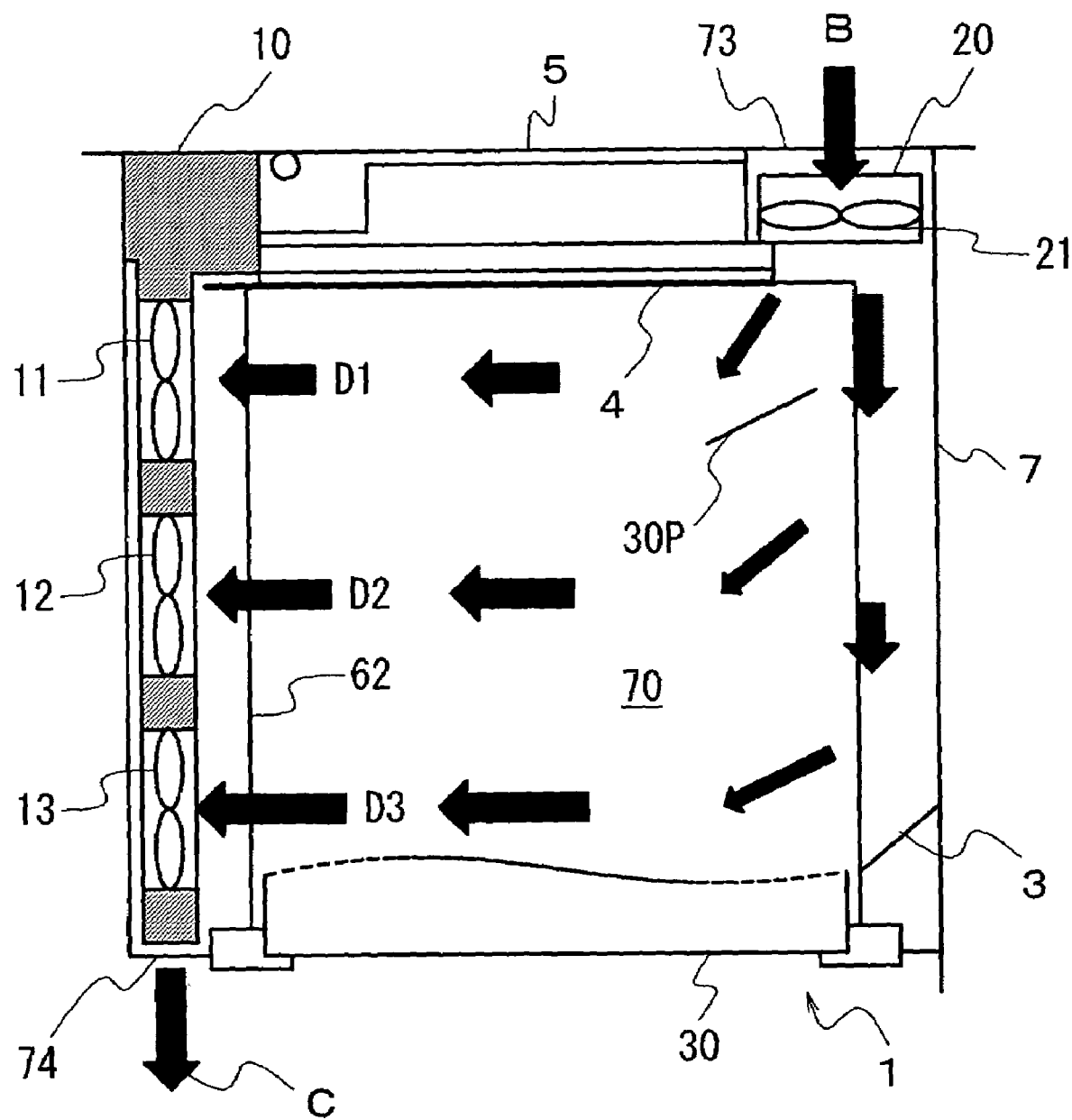
FIG. 3 is a diagram showing distribution of wind velocity vectors in the internal space observed when the rotation speeds of the blower fans are set to an identical value.
Figure 4:
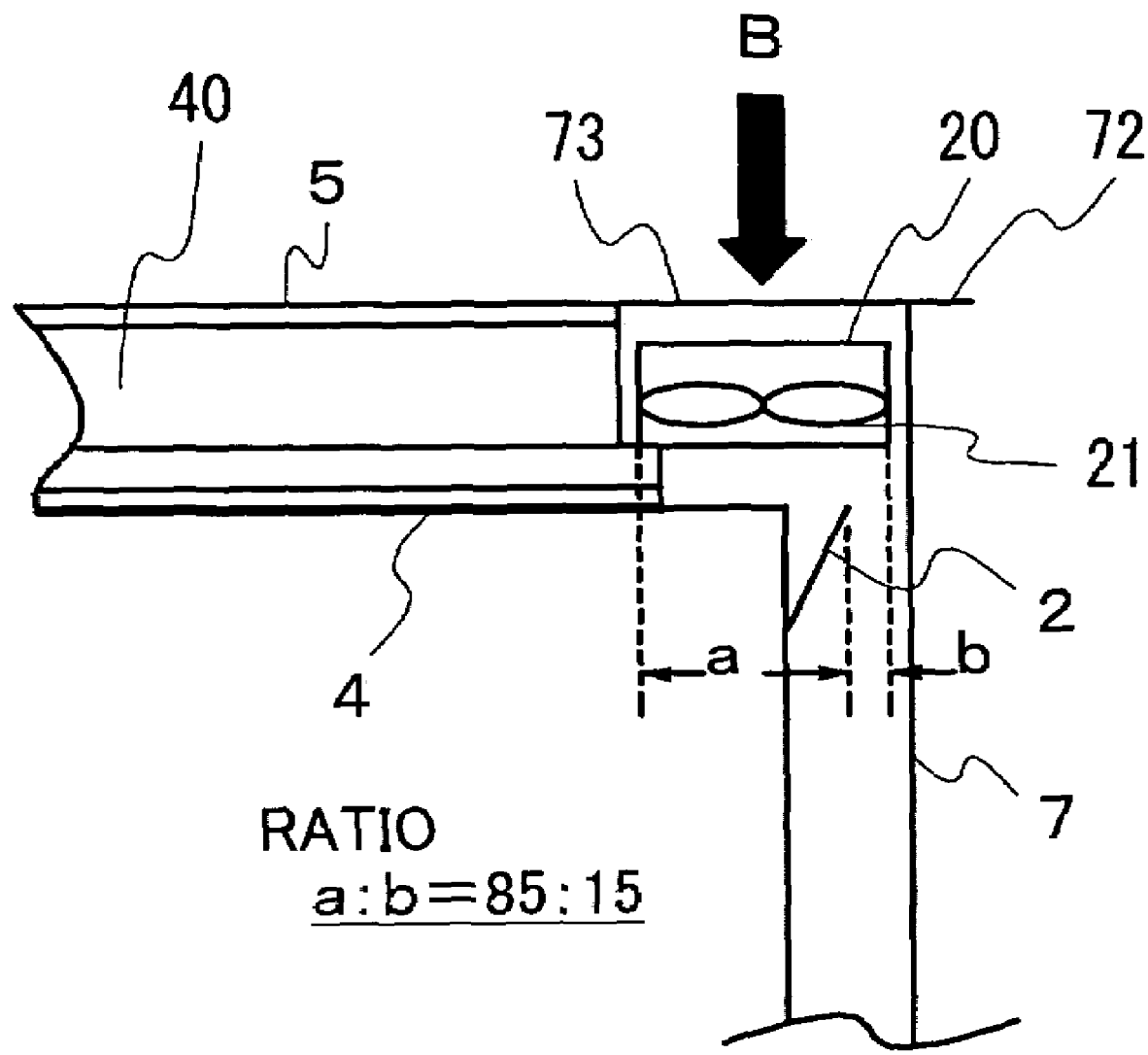
FIG. 4 is a diagram illustrating adjustment of wind velocity vectors by means of a baffle plate.

FIG. 3 shows distribution of wind velocity vectors in the internal space observed when the rotation speeds of the blower fans are set to an identical value, and FIG. 4 illustrates adjustment of wind velocity vectors by means of the baffle plate.

Figure 19:
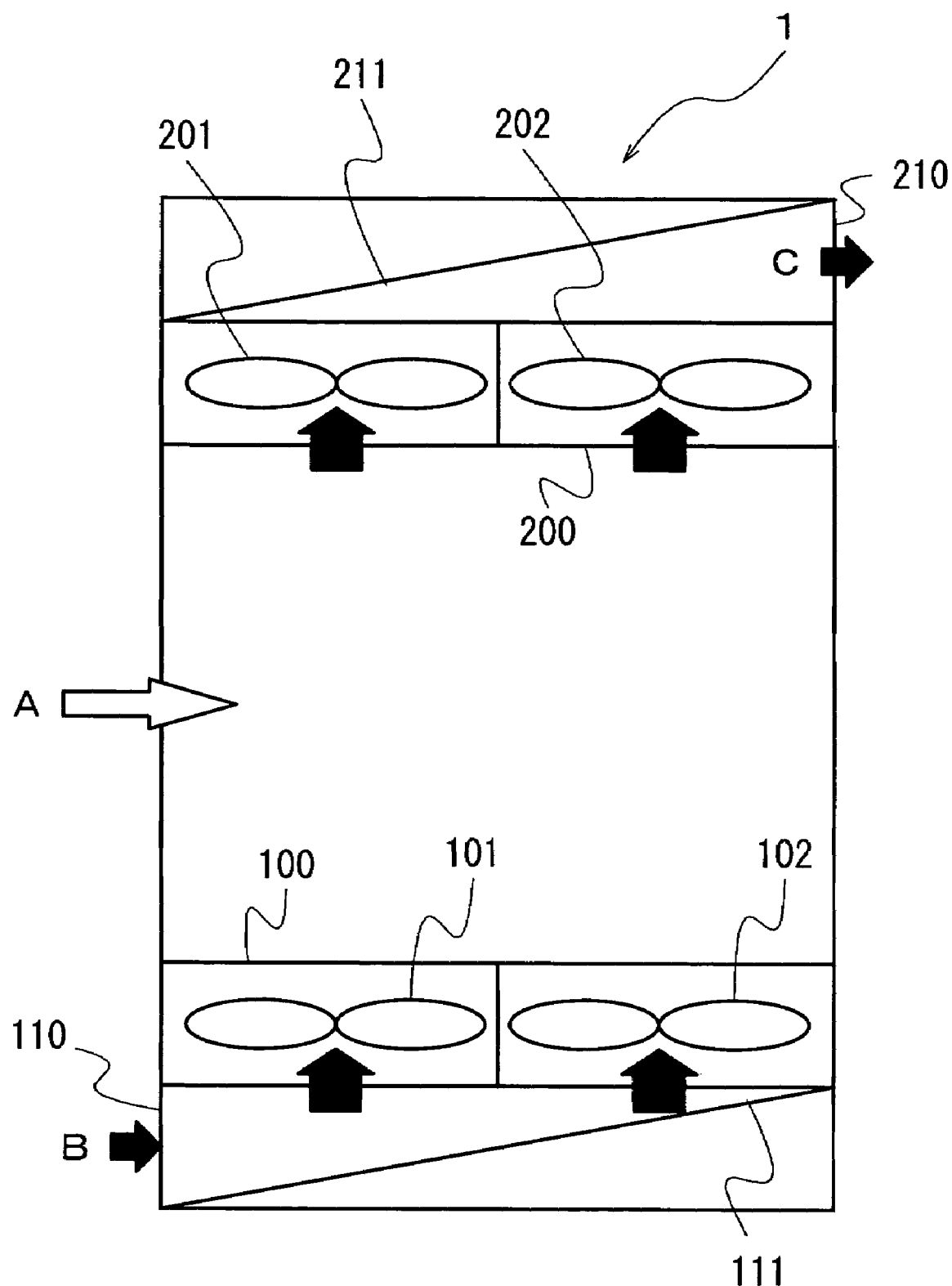
FIG. 19 is a side view showing a schematic construction of a communication device using a conventional cooling system.

In the conventional push-pull type cooling system (FIG. 19) constituted by a plurality of fan units, the push-side fan unit 100 and the pull-side fan unit 200 are operated at different rotation speeds. Within the fan unit constituted by a plurality of fan motors like the fan unit 10, however, the fan motors are controlled so that they may always be operated at the same rotation speed.

In the case where the three blower fans 11, 12 and 13 constituting the fan unit 10, as shown in FIG. 3, are operated at the same rotation speed, the blower fan 13 closest to the air outlet 74 shows the greatest wind velocity vector D3, the middle blower fan 12 shows the second greatest wind velocity vector D2, and the blower fan 11 farthest from the air outlet 74 shows the smallest wind velocity vector D1.

The differences in magnitude among the wind velocity vectors D1, D2 and D3 are attributable to unevenness of air flow rate in the interior of the casing 7 and make it difficult to dispel heat generated by the horizontally mounted plug-in unit 30 to outside without fail, possibly causing local increase of temperature inside the communication device 1. Accordingly, as shown in FIG. 4, the baffle plate 2 is arranged in the aforementioned position of the air duct 61 communicating with the air inlet 73, to divide the air flow introduced into the casing 7. In the illustrated example, the baffle plate 2 is positioned such that, provided the opening area of the inlet side of the fan unit 20 is 100, the area of the fan unit opening into the internal space 70 of the casing 7 is 85 while the area of the fan unit for diverting the air flow into the air duct 61 is 15. Consequently, even when the three blower fans 11, 12 and 13 are operated at the same speed, the wind velocity vectors D1, D2 and D3 can be adjusted so as to have an identical magnitude, and this was confirmed by the experiments.

Figure 5:
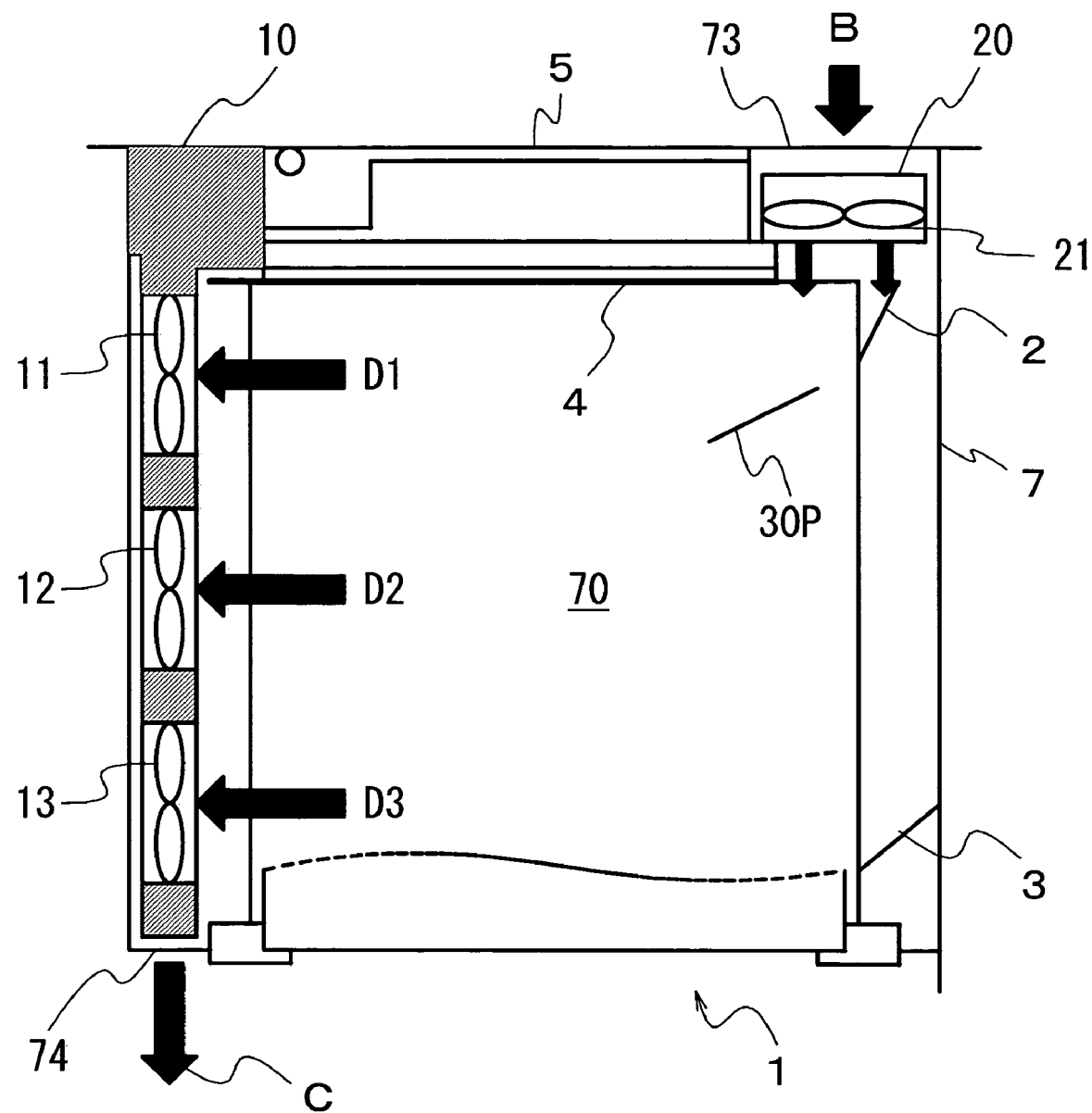
FIG. 5 is a diagram showing suction vectors observed when the axial fan is stopped.

FIG. 5 shows suction vectors observed when the axial fan is stopped.

Even while the axial fan 21 is stopped, cooling air flows into the communication device 1 from the air inlet 73 through spaces between the blades of the axial fan 21, as shown in FIG. 5. Usually, the axial fan 21 is not always operated and the blower fans 11, 12 and 13 alone are operated. The axial fan is controlled such that only when the temperature in the communication device 1 rises to a level higher than or equal to a predetermined temperature or when the fan unit 10 is detached for replacement of blower fans, for example, the axial fan is temporarily operated. With the fan unit 20 constituted by the axial fan 21, therefore, cooling air can be sucked in through the air inlet 73 even while the axial fan is stopped.

Since cooling air can be taken in through the spaces between the blades of the axial fan 21 even while the axial fan 21 is at rest, no additional air inlet needs to be formed separately from the air inlet 73. When the internal temperature is so high that the axial fan 21 is operated, cooling air is introduced from the same air inlet 73.

The cooling fan unit of the present invention will be now described taking the fan unit 10 of the communication device 1 as an example.

Figure 6:
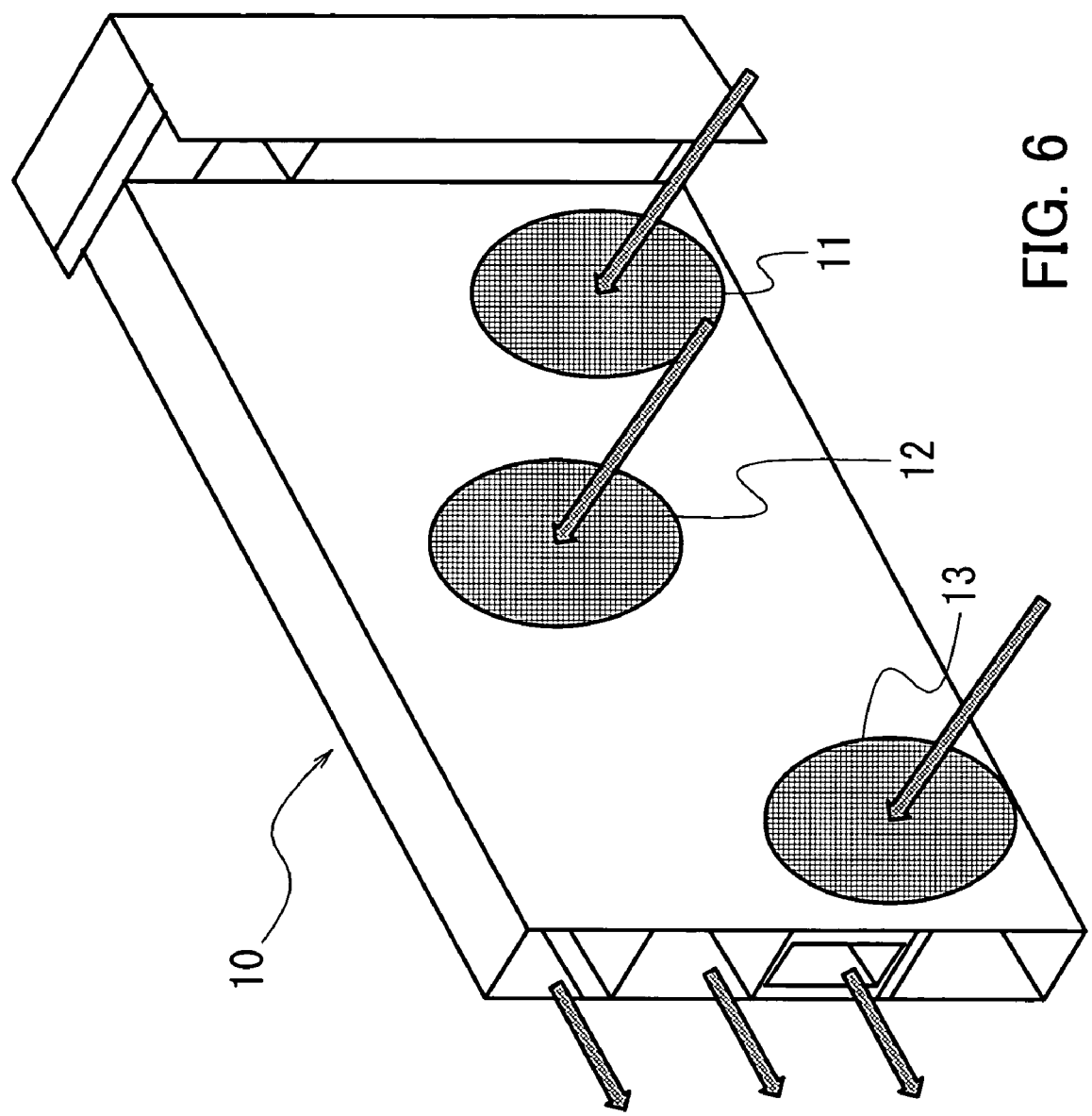
FIG. 6 is a perspective view showing external appearance of a fan unit including three blower fans.
Figure 7:
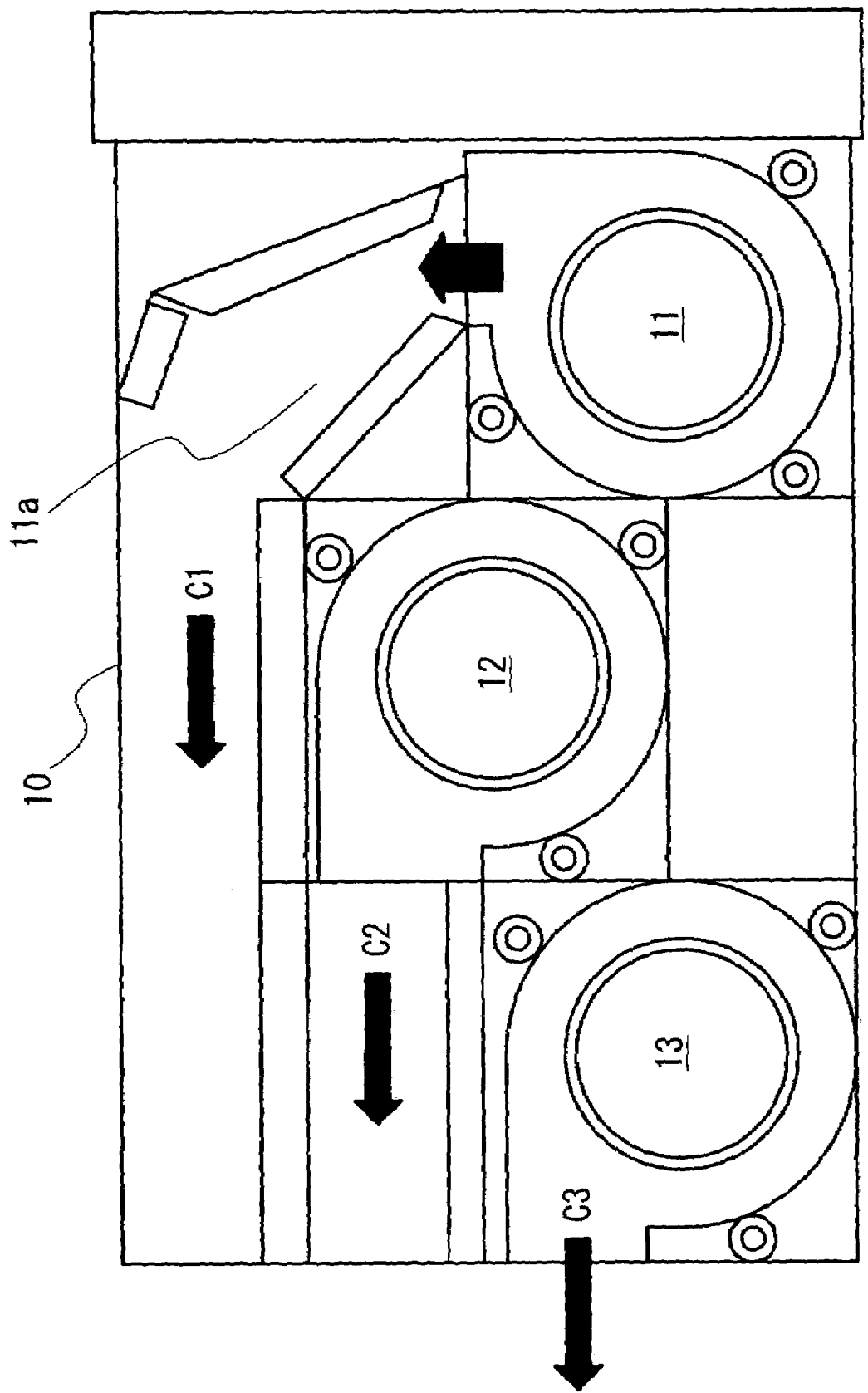
FIG. 7 is a side view of the fan unit, showing discharge vectors of the respective blower fans.

FIG. 6 is a perspective view showing external appearance of the fan unit with three blower fans, and FIG. 7 is a side view of the fan unit and shows discharge vectors of the respective blower fans.

As shown in the figures, the fan unit 10 communicating with the air outlet 74 of the communication device 1 is constructed such that the three blower fans 11, 12 and 13 are arranged at different levels, or in a staggered fashion.

Let it be assumed that the plug-in unit 30 mounted horizontally to the communication device 1 contains electronic circuit boards in such a manner that the lower the board is located in the internal space 70, the more electricity it consumes. The gap G is provided between the plug-in unit 30 horizontally positioned in the casing 7 and the fan unit 10, as shown in FIG. 1. In addition, the three blower fans 11, 12 and 13 are arranged in a staggered fashion so that the cooling air introduced into the casing 7 may flow concentratedly toward the lower electronic circuit boards 31, 32, etc., whereby the electronic circuit boards can be efficiently cooled. Also, since no extra space is needed above and below the fan unit 10, the vertical size of the communication device 1 can be reduced with ease.

As shown in FIG. 7, the blower fans 12 and 13 are arranged such that they discharge air in the same direction as the air outlet 74 with which the fan unit 10 communicates, and the blower fan 11 alone is arranged such that the air discharge direction thereof is at a right angle with that of the fan unit 10. The blower fan 11 is arranged in this manner in order to permit reduction in the vertical size of the fan unit 10, and to this end, an outlet duct 11a is arranged in communication with the outlet of the blower fan 11 to cause the discharged air to be directed to the air outlet 74 with which the fan unit 10 communicates.

Thus, to keep the temperature in the communication device 1 at a constant value by means of the multiple blower fans 11, 12 and 13, the blower fans are arranged in a staggered fashion, rather than in alignment, whereby not only the cooling target can be concentratedly cooled but the blower fans 11, 12 and 13 can be efficiently arranged inside the fan unit 10.

Figure 8:
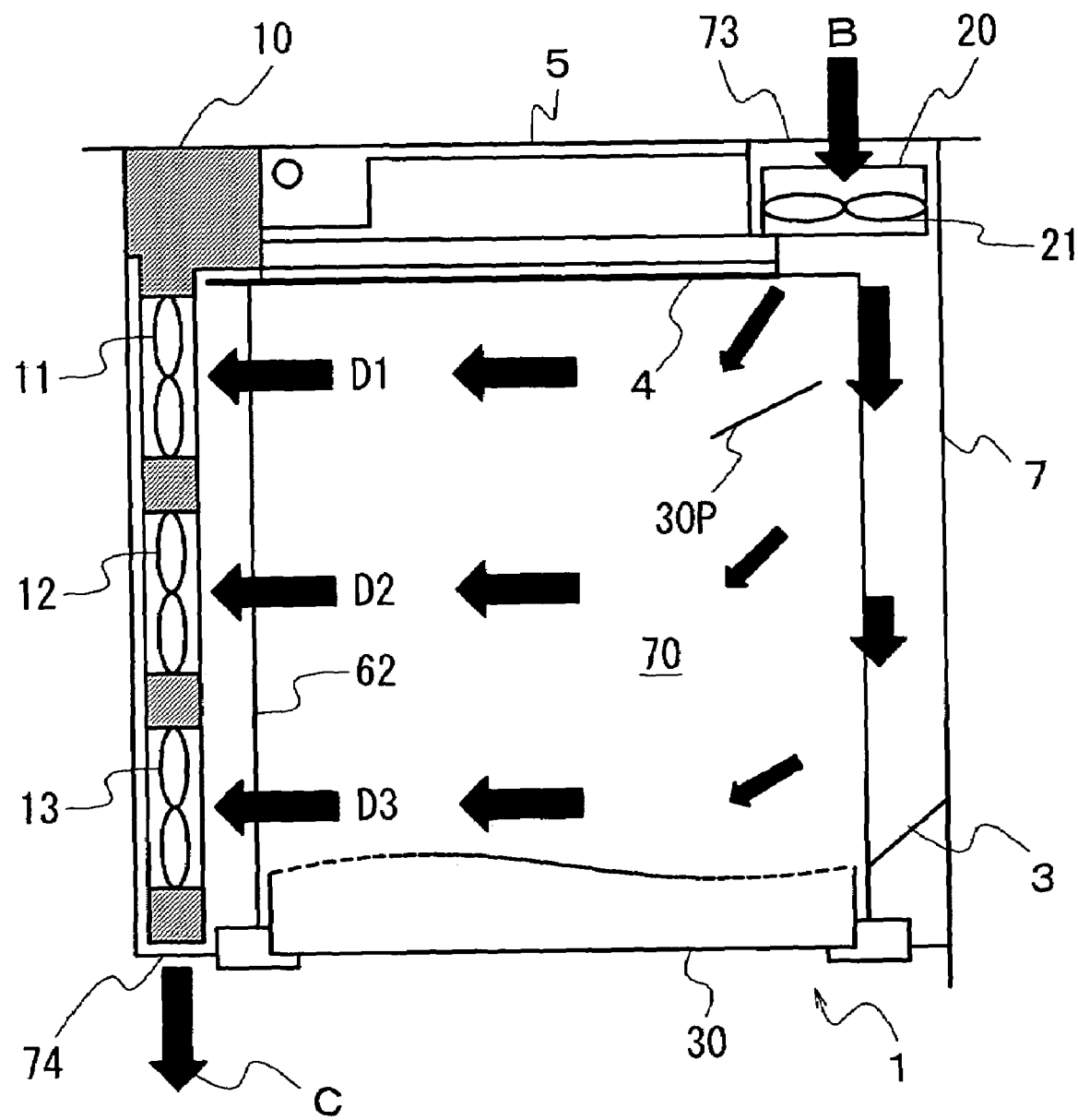
FIG. 8 is a diagram showing distribution of wind velocity vectors observed when the rotation speeds of the blower fans are set to different values.

FIG. 8 shows distribution of wind velocity vectors observed when the rotation speeds of the blower fans are set to different values.

In the fan unit 10 shown in FIG. 8, the blower fans 11, 12 and 13 are operated at rotation speeds R1, R2 and R3 (R1>R2>R3), respectively. In this case, the wind velocity vectors D1, D2 and D3 associated with the three blower fans 11, 12 and 13 can be made equal even if the baffle plate 2 shown in FIG. 1 is not provided. Accordingly, where the blower fans 11, 12 and 13 of the fan unit 10 are operated at different rotation speeds, the interior of the casing 7 can be easily cooled by the cooling air flowing at a uniform rate therein, compared with the communication device of FIG. 1.

Figure 9:
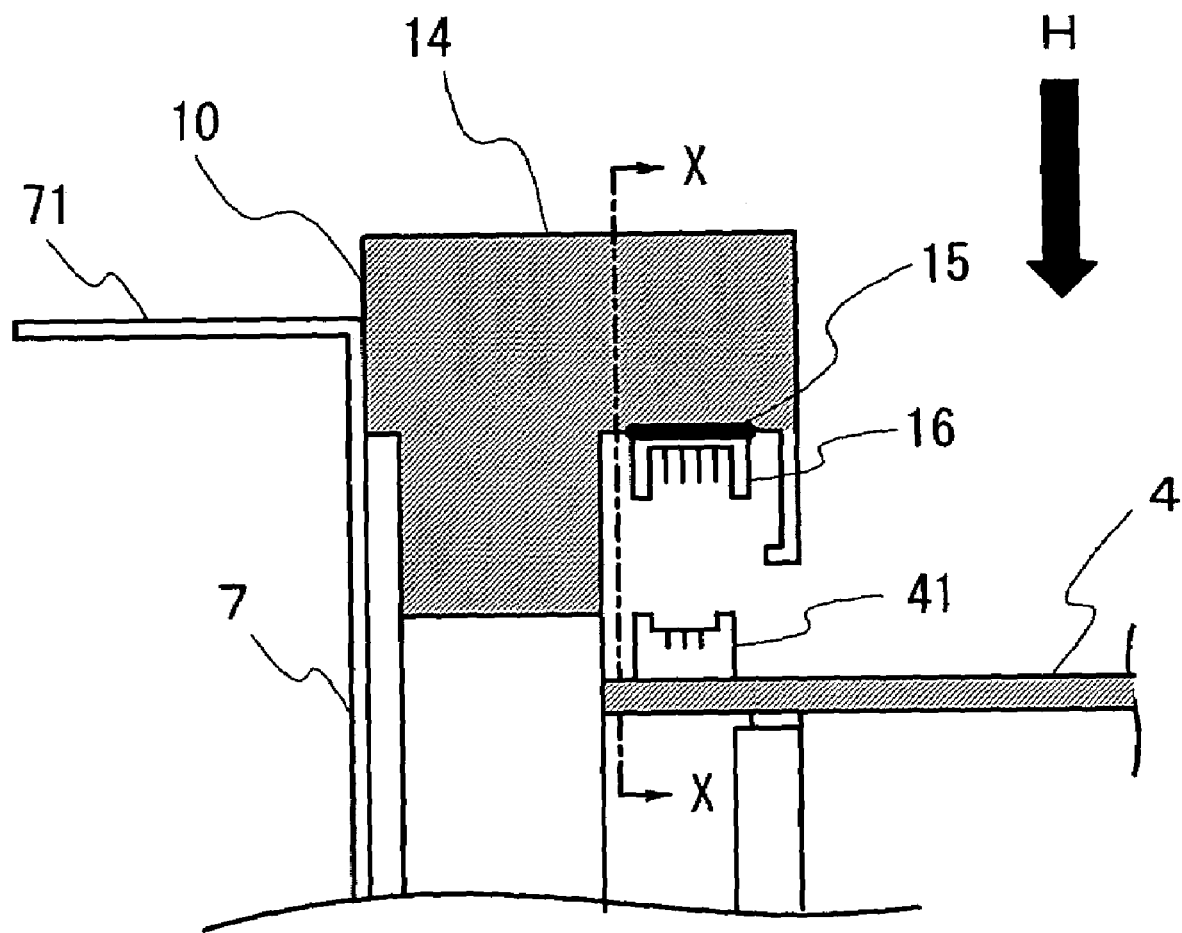
FIG. 9 is a sectional plan view showing an attachment/detachment mechanism for the blower fans.

FIG. 9 is a sectional plan view showing the attachment/detachment mechanism for the blower fans.

The fan unit 10 is inserted into the left-hand air duct 62 of the casing 7 from the back of the communication device 1, as mentioned above, and comprises a fan unit casing 14 containing the three blower fans 11, 12 and 13, and a control circuit board 15 arranged on that surface of a rear end portion of the fan unit casing 14 which faces the BWB 4 in parallel therewith. A plug-in connector 16 for receiving external signal is arranged at a predetermined position on the control circuit board 15, to allow the operation of the blower fans to be controlled in accordance with the external signal. The control circuit board 15 is arranged parallel with the BWB 4, and therefore, as the fan unit 10 is inserted into the casing 7 up to a predetermined position, the plug-in connector 16 automatically connects with a connector 41 of the BWB 4.

Namely, the electronic circuit boards, which are to be cooled by the fan unit 10 and which are not shown in FIG. 9, are inserted from the front side of the BWB 4 and are electrically connected by the BWB 4. The connector 41 is arranged on the rear side of the BWB 4 at a location connectable with the plug-in connector 16, and accordingly, as the fan unit casing 14 is inserted in a direction indicated by arrow H until the rear end face thereof becomes flush with the fixture 71, the two connectors are connected to each other and electrical connection thereof is established. Also, since the control circuit board 15 and the BWB 4 are arranged parallel with each other, the control circuit board 15 with a large size can be used depending on the area of the BWB 4, thus permitting the plug-in connector 16 of the control circuit board 15 and the connector 41 of the BWB 4 to be located with a higher degree of freedom.

Figure 10A:
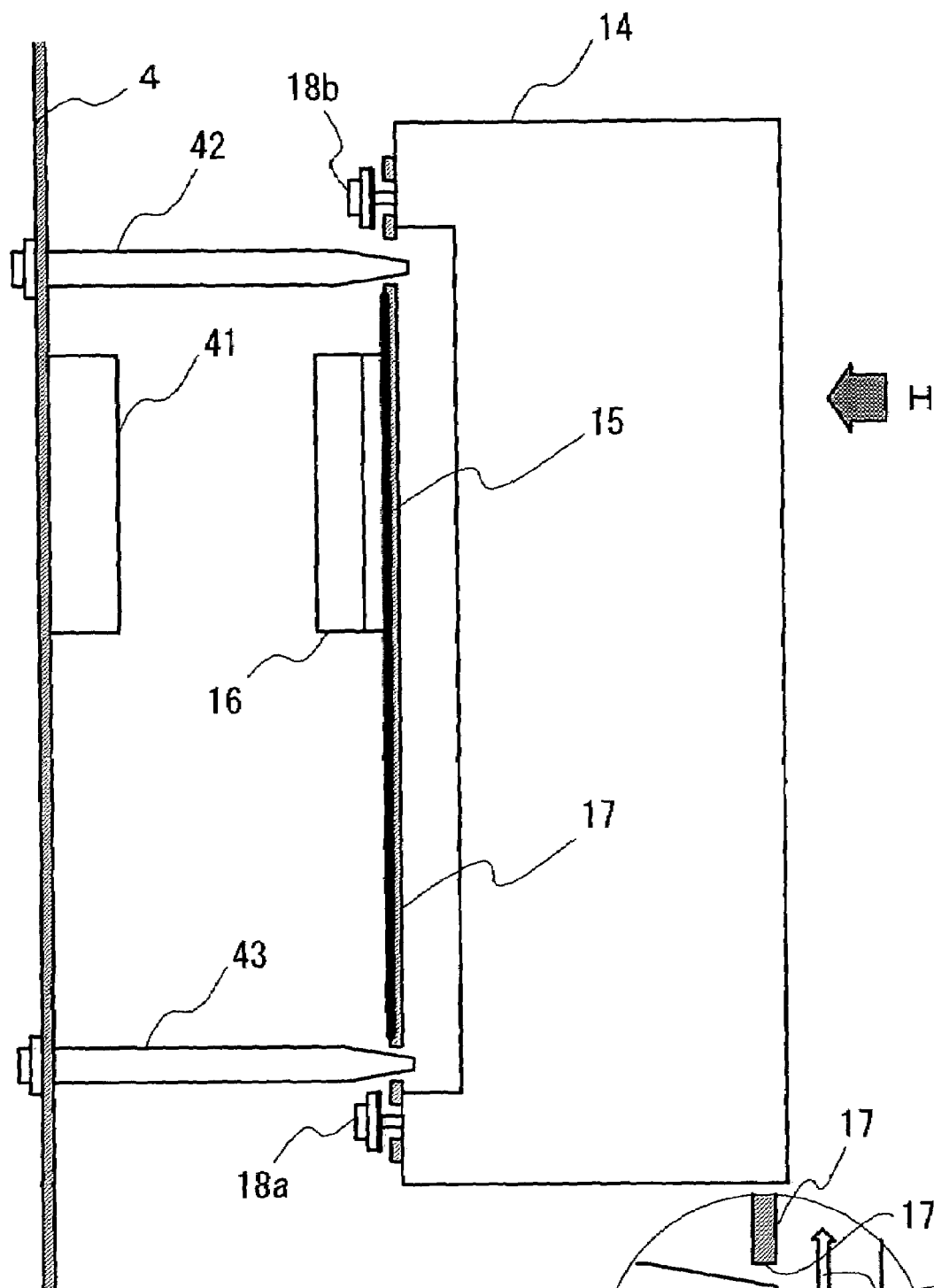
FIG. 10A is a sectional side view showing the fan unit before a plug-in connector is connected and FIG. 10B is a partial enlarged sectional view of FIG. 10A.

FIG. 10A is a sectional side view showing the fan unit before the plug-in connector is connected. The figure shows only the rear end portion of the fan unit casing 14 taken along line X—X in FIG. 9.

The fan unit 10 has a floating plate 17 slidably holding the control circuit board 15. The floating plate 17 has circular holes 17h of predetermined size formed near the respective four corners thereof, and is held so as to be slidable in a plane parallel to the BWB 4 by means of the circular holes 17h and bolts 18a and 18b fixed to the fan unit casing 14 with spacers (not shown) therebetween. Also, guide pins 42 and 43, each tapered at a distal end portion thereof, protrude from the BWB 4, and guide holes 17g are formed through the floating plate 17 at locations corresponding to the respective guide pins 42 and 43.

Figure 10B:
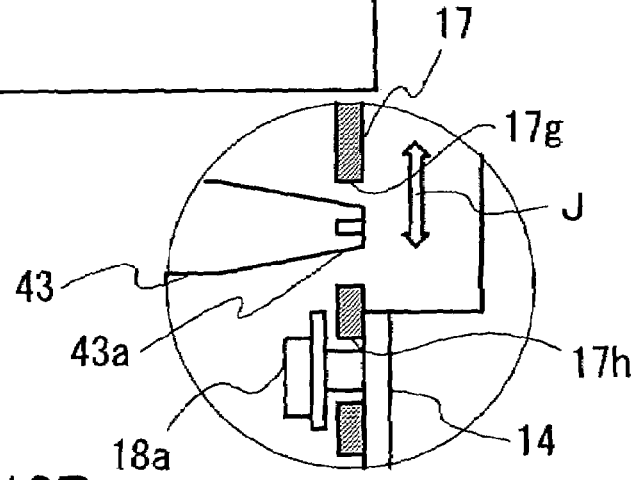

As seen from the enlarged part shown in FIG. 10B, the guide holes 17g have a size corresponding to the diameter of the guide pins 43. Accordingly, as the fan unit casing 14 is moved in a direction indicated by arrow H in the figure to be fitted into the casing 7 of the communication device 1, the floating plate 17 is first allowed to slide freely in a direction indicated by arrow J and the plug-in connector 16 of the control circuit board 15 is finally positioned with respect to the connector 41 of the BWB 4.

Figure 11:
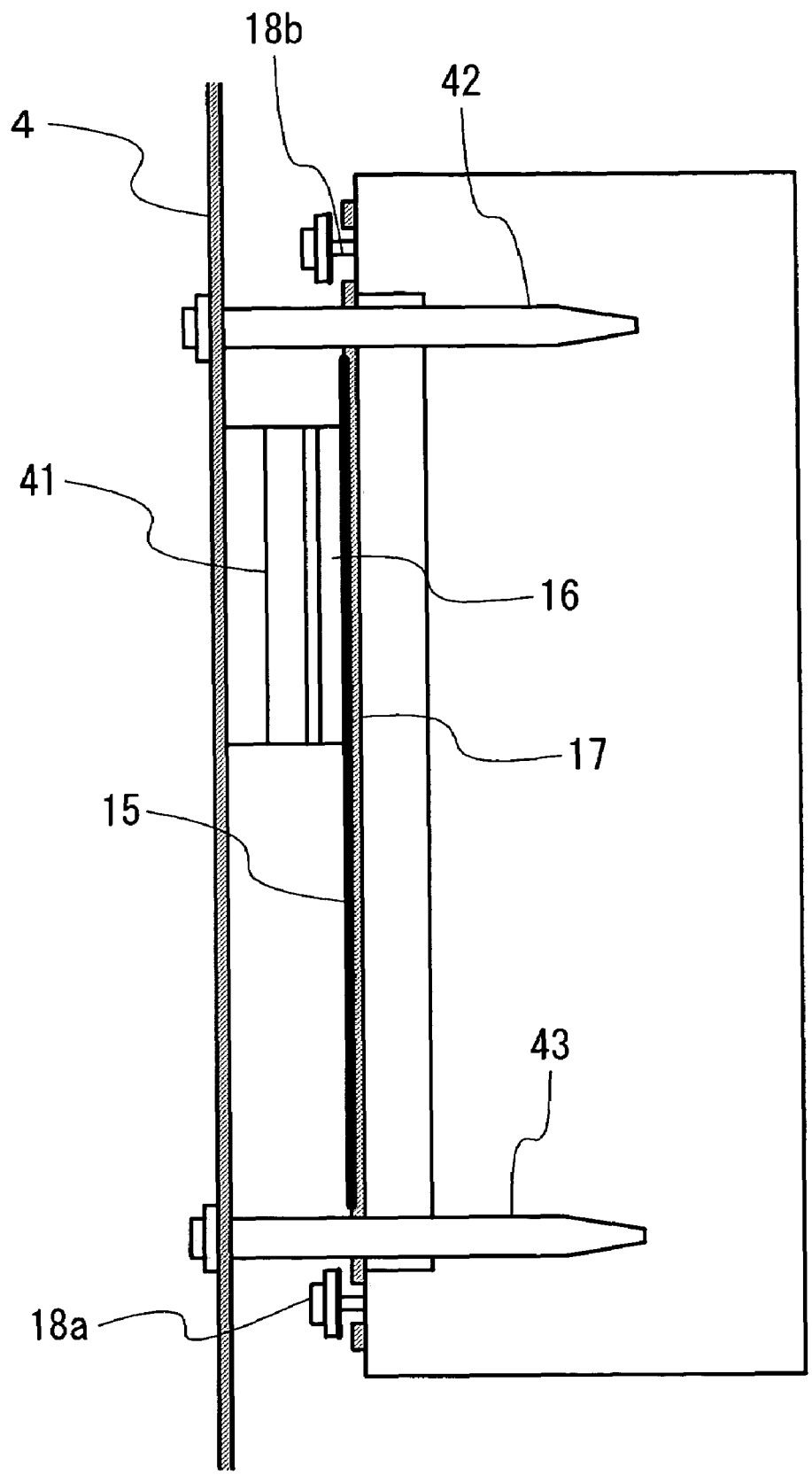
FIG. 11 is a sectional side view showing the fan unit after the plug-in connector is connected.

FIG. 11 is a sectional side view showing the fan unit after the plug-in connector is connected.

When the plug-in connector 16 connects with the connector 41 of the BWB 4, the floating plate 17 to which the control circuit board 15 is fixed is positioned by the two guide pins 42 and 43. Because of the spacers provided between the circular holes 17h and the respective bolts 18a and 18b, there is play between the floating plate 17 and the fan unit casing 14. The play serves to absorb errors caused during the assembling of the communication device 1 and of the fan unit casing 14, and also permits the plug-in connector to be positioned relative to the connector 41 as the guide pins 42 and 43 are inserted through the respective guide holes 17g of the floating plate 17. This not only lightens the labor associated with the connection of the connectors when the fan unit 10 is mounted, but prevents the plug-in connector 16 from developing defects such as bending of its connector pins.

An operation control method for the cooling fan unit of the present invention will be now described taking, as an example, the aforementioned fan unit 10 for cooling the communication device 1.

Figure 12:
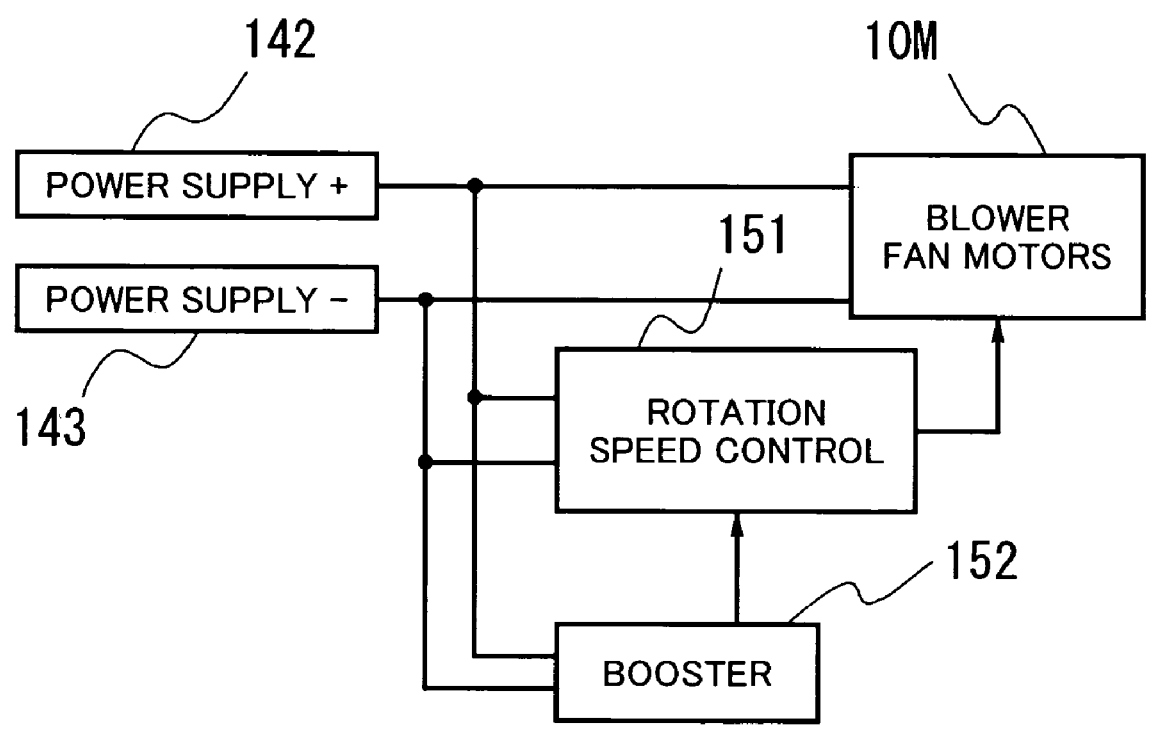
FIG. 12 is a block diagram illustrating the function of a booster circuit.

FIG. 12 is a block diagram illustrating the function of a booster circuit.

As shown in the figure, positive and negative power supplies 142 and 143 supply electric power to blower fan motors 10M, a rotation speed control circuit 151, and a booster circuit 152. The rotation speed control circuit 151 controls the rotation speeds of the blower fan motors 10M to a constant speed and is supplied with a boost signal from the booster circuit 152.

When the fan unit 10 starts to cool the communication device 1, the aforementioned alarm masking time should preferably be made identical with that for the axial fan. Accordingly, the booster circuit 152 associated with the fan unit 10 is switched on for several hundred milliseconds immediately after the start of power supply so that a voltage higher than that for normal operation may be supplied to the blower fan motors 10M only for the on-period, to thereby increase the rotation speeds up to a stable speed in a short period of time.

Figure 13:
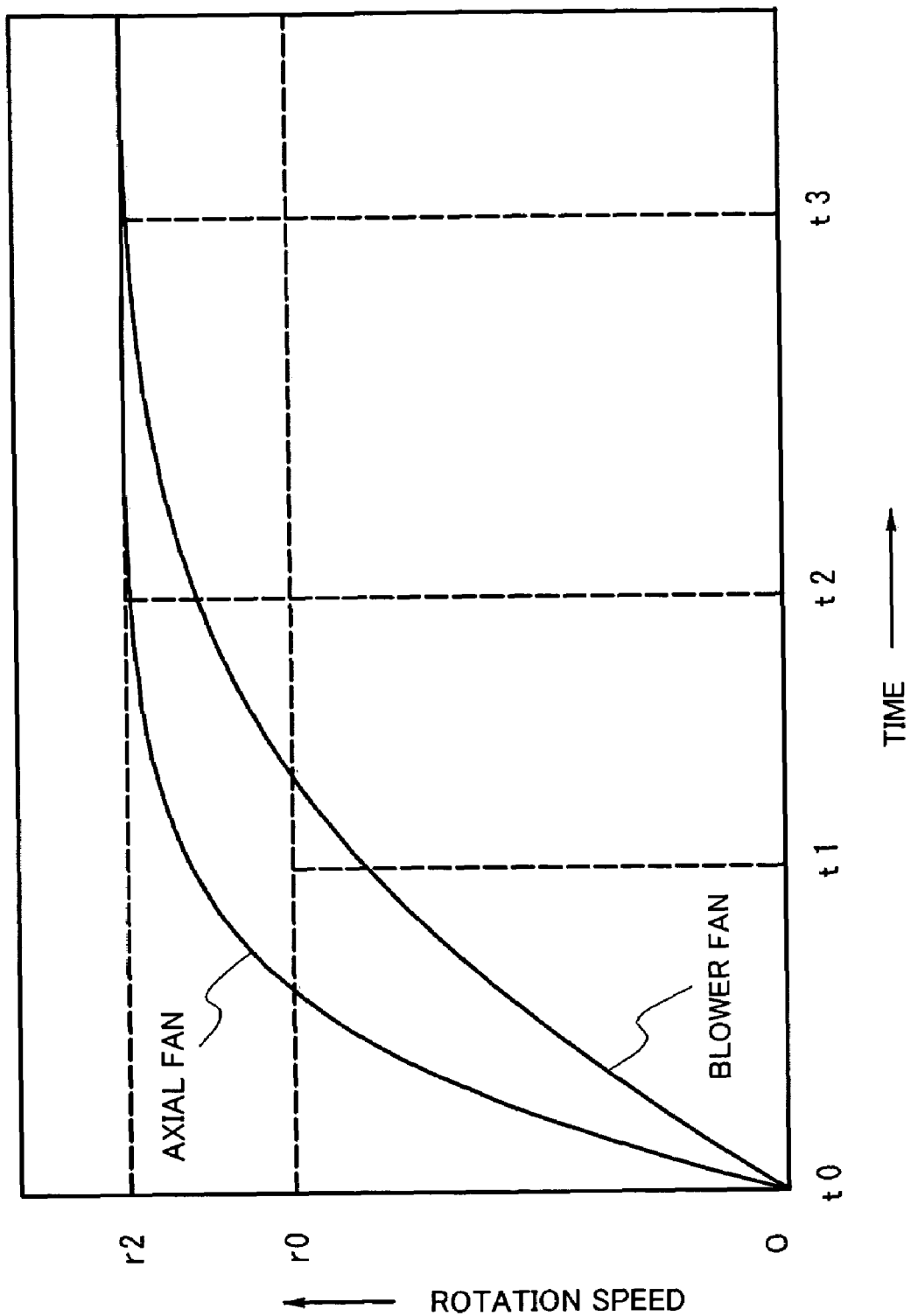
FIG. 13 is a graph showing change in rotation speed of the blower fan equipped with the booster circuit.

FIG. 13 shows change in rotation speed of the blower fan provided with the booster circuit, wherein the horizontal axis indicates time and the vertical axis indicates rotation speed.

Symbol t0 indicates the operation start time, and t1 indicates the alarm masking time for ordinary axial fans. In the case of an axial fan, the rotation speed reaches r2 at the time t2 and is stabilized, but in the case of a blower fan, the rotation speed does not even reach specified speed r0 (minimum guaranteed speed) at the time t1 and reaches stable rotation speed r2 as late as time t3. Accordingly, by switching on the booster circuit 152 shown in FIG. 12 up to the time t2, it is possible to shorten the time required until the rotation speed of the blower fan is stabilized. After the time t2 at which the stable rotation speed r2 is reached, the booster circuit 152 is switched off to supply the blower fans with a normal voltage. As a consequence, the alarm masking time for the blower fans can be set to the same length as that for the axial fan.

Figure 14:
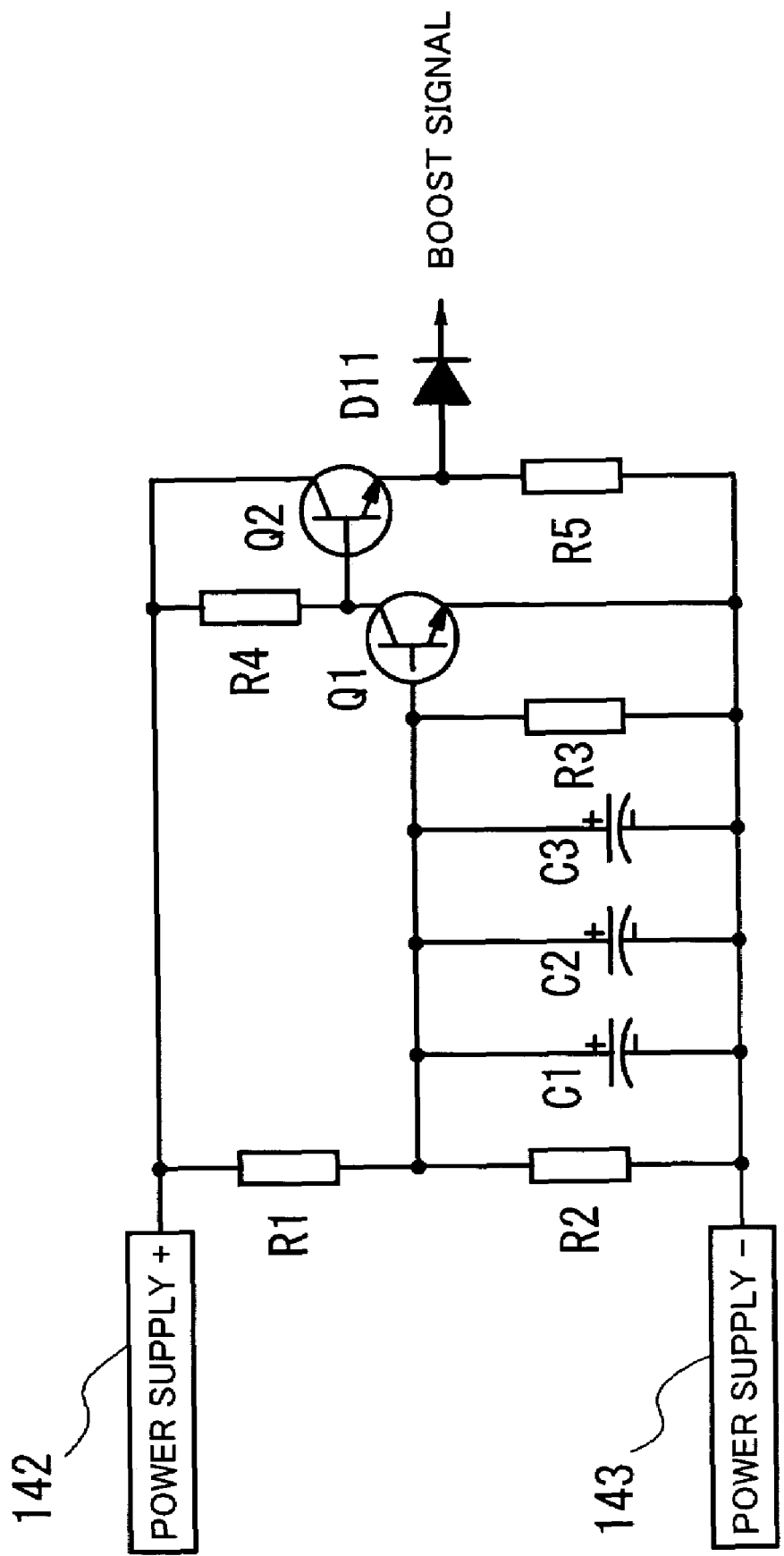
FIG. 14 is a block diagram showing an exemplary booster circuit.

FIG. 14 is a block diagram showing an exemplary booster circuit.

In the booster circuit 152, a series circuit of resistors R1 and R2, a series circuit of a resistor R4 and a transistor Q1, and a series circuit of a transistor Q2 and a resistor R5 are connected between positive and negative power supplies 142 and 143. The transistor Q1 has its base connected to the junction point between the resistors R1 and R2, as well as to capacitors C1 to C3 and a resistor R3. The transistor Q2 has its base connected to the junction point between the resistor R4 and the transistor Q1, and outputs at its emitter the boost signal through a diode D11.

By using the booster circuit 152, it is possible to temporarily increase the starting torque of the blower fans only for a short period immediately after the start of operation of the cooling fan unit. Thus, where the blower fans are fitted into the casing containing electronic circuit boards, the rotation speeds of the blower fans can be made to reach a steady-state value in an early stage after the start of the fans, thereby shortening the time needed for the blower fans to reach the specified rotation speed r0 as well as the time required until the rotation speeds are stabilized at the start of the fans. Therefore, the booster circuit which is thus very simple in construction and is inexpensive has only to be incorporated into the cooling fan unit for cooling the communication device. Since a control circuit almost identical with that for the axial fan which is very often used in this type of device can be used for blower fans that require a longer starting time, the device can be reduced in size and cost.

Figure 15:
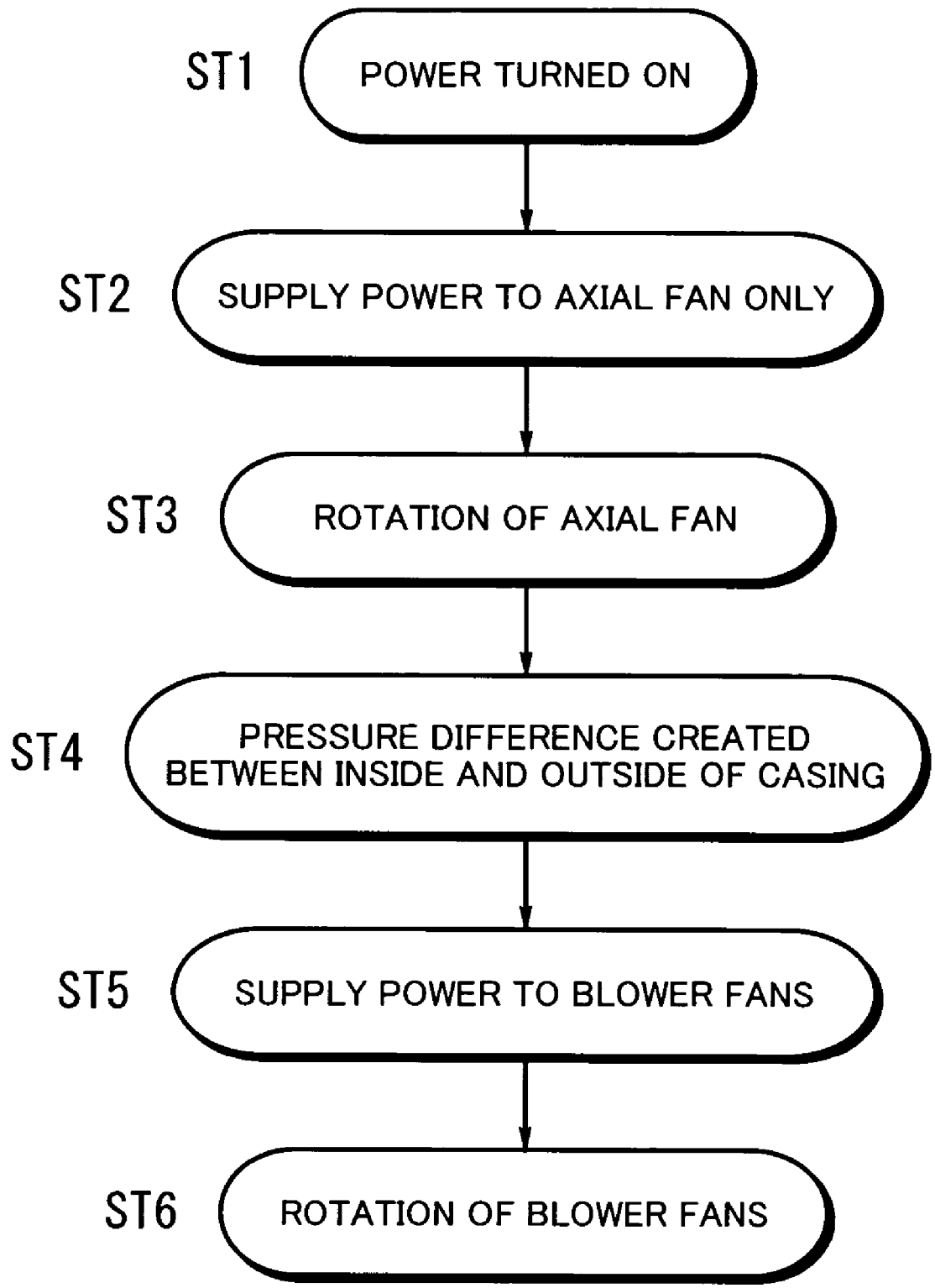
FIG. 15 is a flowchart showing a procedure for rotation control of the axial fan and the blower fans.

FIG. 15 is a flowchart showing a procedure for rotation control of the axial fan and the blower fans.

In the cooling system whose discharge fan unit 10 is constituted by the blower fans 11, 12 and 13 as in the communication device 1 shown in FIG. 1, only the intake fan unit 20 for introducing cooling air into the casing 7 is operated for a short period of time after the start of operation of the cooling system, and after a predetermined pressure difference is created between the inside and outside of the casing 7, operation of the blower fans 11, 12 and 13 is started, whereby the time needed for the blower fans to reach a steady-state rotation speed after the start thereof can be shortened, as in the case of using the aforementioned booster circuit.

In Step ST1 in FIG. 15, the main power supply is turned on. Then, in Step ST2, electric power is supplied only to the axial fan, to rotate the axial fan motor first, in Step ST3.

At this point of time, the blower fans are not rotating, and therefore, cooling air is just introduced into the casing 7 of the communication device 1 without being discharged. Accordingly, after a lapse of about 1.5 seconds by which the axial fan reaches a stable rotation speed, the pressure in the casing 7 is relatively high compared with the outside pressure (Step ST4). While in this state, electric power is supplied to the blower fans (Step ST5), to rotate the blower fan motors (Step ST6). Consequently, the difference in pressure between the inside and outside of the casing 7 serves as a mechanical boosting function to accelerate the blower fans, so that the blower fan motors reach the specified rotation speed in a short time.

The following describes a method of switching operation modes of the cooling system in accordance with environmental conditions of the communication device, such as ambient temperature of the device and operating states of the fans, after the operation of the fan units constituting the cooling system is stabilized.

Figure 16:
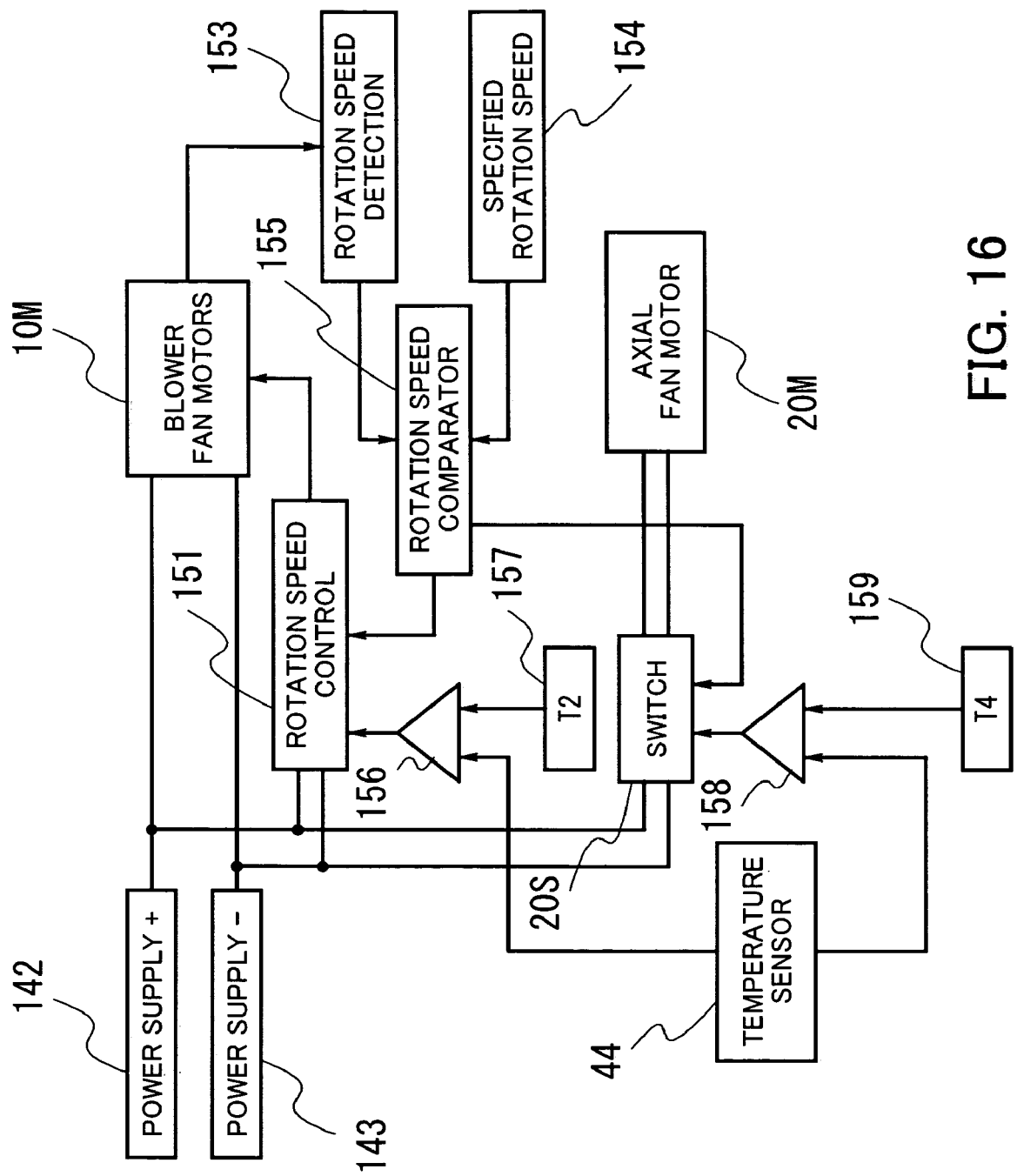
FIG. 16 is a diagram showing a sequential control circuit for driving the blower fans and the axial fan.

FIG. 16 shows a sequential control circuit for driving the blower fans and the axial fan.

As seen from FIG. 16, positive and negative power supplies 142 and 143 supply electric power to the blower fan motors 10M and a rotation speed control circuit 151, and also to the axial fan motor 20M through a switching circuit 20S. The blower fan motors 10M are connected to a rotation speed detection circuit 153. The detection circuit 153 and a specified rotation speed circuit 154 are connected to a rotation speed comparator circuit 155 thereby to monitor the operation states of the blower fan motors.

A comparator 156 is connected with a threshold circuit 157 for outputting a temperature T2, to monitor the temperature input from a temperature sensor 44 for detecting the ambient temperature of the communication device 1. Specifically, when the ambient temperature is higher than the temperature T2, the rotation speed control circuit 151 is instructed to operate the blower fans at a high rotation speed r2, and when the ambient temperature is lower than a temperature T1 (=T2−ΔT), the control circuit 151 is instructed to rotate the blower fans at a low rotation speed r1.

The switching circuit 20S is connected with a comparator 158 and the rotation speed comparator circuit 155, to perform on/off control of the axial fan motor 20M. The comparator 158 is connected with a threshold circuit 159 for outputting a temperature T4, thereby to monitor the temperature input from the temperature sensor 44 for detecting the ambient temperature of the communication device 1. Specifically, when the ambient temperature is higher than the temperature T4, the switching circuit 20S switches the operation of the axial fan to be operated at a predetermined rotation speed r3, and when the ambient temperature is lower than a temperature T3 (=T4−ΔT), the switching circuit switches the operation of the axial fan to be stopped. ΔT represents temperature hysteresis of the temperature sensor 44 and is usually set to about 5° C.

Figure 17:
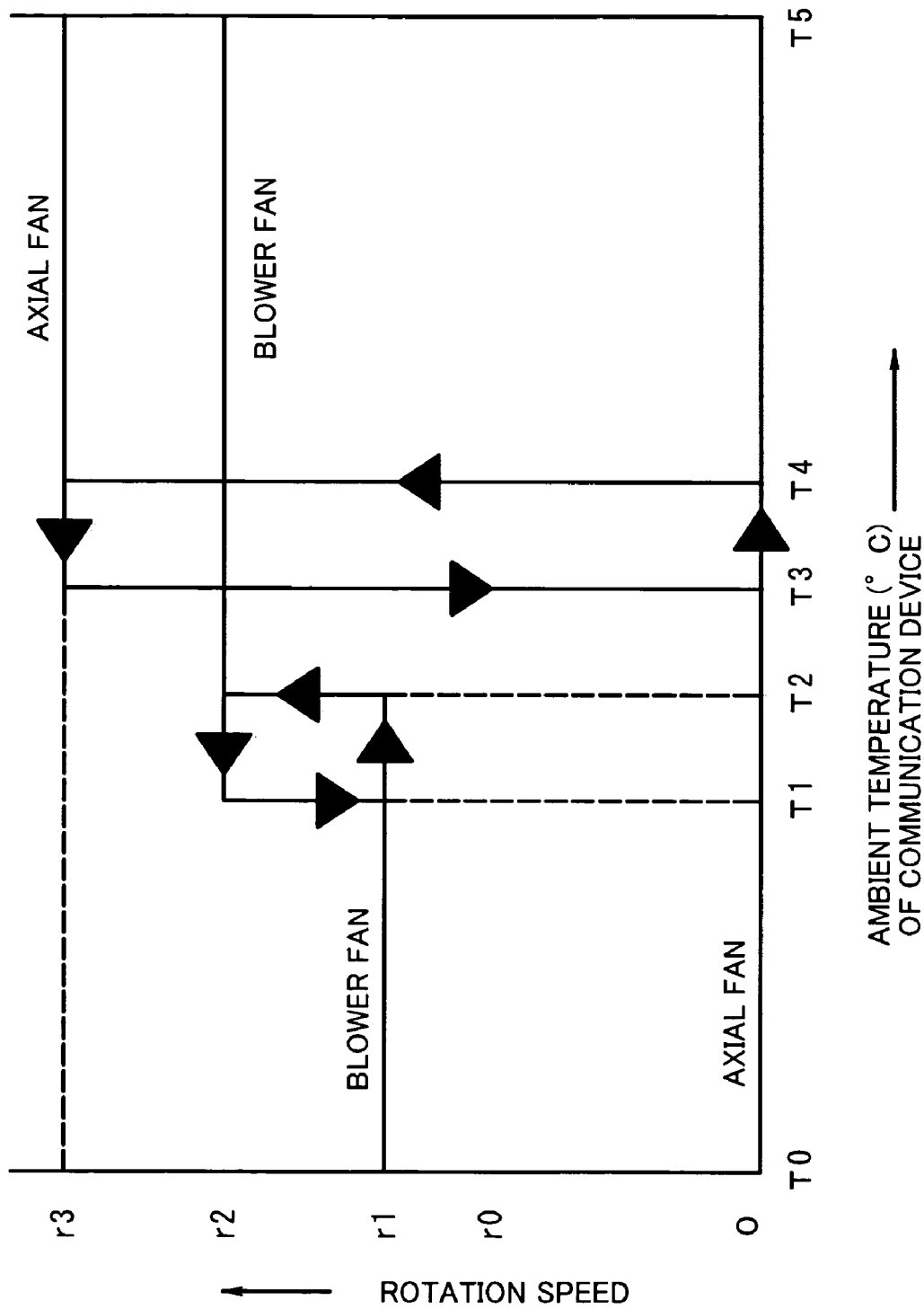
FIG. 17 is a graph showing temperature sequences.

FIG. 17 shows temperature sequences. In the figure, the horizontal axis indicates ambient temperature of the communication device, and the vertical axis indicates rotation speeds of individual fans constituting the fan units.

In the case where the cooling fan unit is constituted by the axial fan 21 for introducing cooling air into the casing 7 of the communication device 1 in which the electronic circuit boards are contained and the blower fans 11, 12 and 13 for discharging the air introduced in the casing 7, as shown in FIG. 1, the communication device 1 needs to be cooled in accordance with the ambient temperature of the device 1. Specifically, in a normally air-conditioned environment (at temperatures below T2 (° C.)), the blower fan motors alone are rotated at low speed (rotation speed r1) in the state shown in FIG. 5, and in this case, the axial fan motor can be kept stopped.

However, in an environment (at temperature T2 (° C.) and above) in which the air conditioning is not normal, the blower fan motors must be controlled to be rotated at high speed (rotation speed r2).

Further, when the air conditioning is not normal and at the same time the ambient temperature is higher than or equal to a predetermined temperature (temperature T4 (° C.)), the axial fan motor is also controlled to be rotated at a predetermined speed (rotation speed r3) with the blower fan motors kept rotating at high speed.

If a blower fan motor stops because of malfunction or the rotation speed thereof drops to or below the minimum speed r0, it is necessary that the axial fan motor be rotated at the predetermined speed (rotation speed r3) to cool the interior of the casing 7, without regard to the ambient temperature of the communication device 1.

FIG. 18 is a table showing the rotation speeds of the blower fans and axial fan in individual operation modes.

The table indicates four operation modes, as a method of controlling the operation of the cooling fan unit in case of emergency, and the rotation speeds of the individual fans in the respective modes. First to third modes (FAIL1 to FAIL3) are modes applicable to the case where the blower fan motor associated with any one of the three blower fans 11, 12 and 13 constituting the discharge fan unit has stopped or the rotation speed thereof has dropped to or below the minimum rotation speed. In these modes, the axial fan 21 is controlled to be rotated at the predetermined speed (rotation speed r3), and at the same time the administrator is notified of a given warning so that the malfunctioning blower fan may be replaced.

During the replacement, the communication device 1 has no blower fans arranged therein. In this case, the cooling fan unit is operated in a different operation mode (REMOVE), as shown in the table, such that the axial fan 21 is rotated at the predetermined speed (rotation speed r3) In the illustrated example, the time period for which the stopped state is maintained is limited to three minutes.

As described above, the communication device of the present invention requires no shielding plates, unlike the conventional push-pull type cooling system using only axial fans. Since the spaces for such shielding plates can be omitted, a space-saving communication device can be provided.

Also, with the cooling fan unit and its operation control method according to the present invention, the operation of the fans can be properly controlled in various environments in accordance with the operating states of the fans. Accordingly, a communication device or the like can be efficiently cooled and also the power consumption of the cooling system can be reduced.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A cooling fan unit for cooling a plurality of electronic circuit boards electrically connected by a BWB, comprising:
   a fan unit casing containing a blower fan;
   a control circuit board ranged parallel with the BWB of the cooling fan unit and facing the BWB, for controlling operation of the blower fan; and
   a plug-in connector arranged in a predetermined position of the control circuit board such that the plug-in connector is connected to a connector on the BWB when the fan unit casing is mounted to a cooling position of the electronic circuit boards, wherein
   the fan unit casing includes a floating plate slidably holding the control circuit board, the floating plate being slid when the fan unit casing is mounted, to permit the plug-in connector of the control circuit board to be positioned with respect to the connector of the BWB.

2. The cooling fan unit according to claim 1, wherein the fan unit casing contains a plurality of blower fans arranged in a staggered fashion.

3. The cooling fan unit according to claim 1, wherein the floating plate has guide holes formed in positions corresponding to respective guide pins protruding from the BWB, the control circuit board being brought to a predetermined position by means of the guide holes, to position the plug-in connector with respect to the connector of the BWB.

4. An operation control method for a cooling fan unit having a blower fan which is fitted in a casing containing an electronic circuit board for cooling interior of the casing, comprising the step of:
   temporarily increasing starting torque of the blower fan only for a short period of time immediately after operation of the cooling fan unit is started, to cause rotation speed of the blower fan to reach a steady-state value in an early stage after start of the blower fan,
   wherein the cooling fan unit comprises a discharge fan unit constituted by the blower fan and an intake fan unit far introducing air into the casing, and the method comprises the step of operating only the intake fan unit only for a short period of time immediately after the operation of the cooling fan unit is started. and starting the blower fan after a predetermined pressure difference is created between inside and outside of the casing.

* * * * *